(12) United States Patent
Takashima

(10) Patent No.: US 6,934,177 B2
(45) Date of Patent: Aug. 23, 2005

(54) FERROELECTRIC MEMORY DEVICE AND READ CONTROL METHOD THEREOF

(75) Inventor: Daisaburo Takashima, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 234 days.

(21) Appl. No.: 10/403,076

(22) Filed: Apr. 1, 2003

(65) Prior Publication Data

US 2004/0013017 A1 Jan. 22, 2004

(30) Foreign Application Priority Data

Apr. 1, 2002 (JP) .................................... 2002-099065

(51) Int. Cl.[7] ..................... G11C 11/22; G11C 11/24
(52) U.S. Cl. ................................. 365/145; 365/149
(58) Field of Search ............................ 365/145, 149

(56) References Cited

U.S. PATENT DOCUMENTS

| | | | | |
|---|---|---|---|---|
| 5,144,583 A | * | 9/1992 | Oowaki et al. | 365/149 |
| 6,363,003 B1 | * | 3/2002 | Miyamoto | 365/145 |
| 6,366,490 B1 | * | 4/2002 | Takeuchi et al. | 365/145 |
| 6,493,251 B2 | * | 12/2002 | Hoya et al. | 365/145 |
| 6,522,569 B2 | * | 2/2003 | Miyakawa et al. | 365/149 |
| 6,819,582 B2 | * | 11/2004 | Kang | 365/145 |

OTHER PUBLICATIONS

D. Takashima et al., "High–Density Chain Ferroelectric Random–Access Memory (CFRAM)," in Proc. VLSI Symp. Jun. 1997, pp. 83–84.

* cited by examiner

*Primary Examiner*—Trong Phan
(74) *Attorney, Agent, or Firm*—Oblon, Spivak, McClelland, Maier & Neustadt, P.C.

(57) ABSTRACT

A nonvolatile ferroelectric memory device is disclosed, which includes a cell block which includes a series-connection of a plurality of unit cells each having a ferroelectric capacitor with its both ends connected to the source and drain of a cell transistor, a pair of bit lines to which both ends of the cell block are connected through block select gates respectively, word lines each connected to the gate of a corresponding cell transistor of the cell block, a plate line to which a node of a unit cell at a specified position within the cell block is connected via a plate-line select gate, and a sense amplifier having differential input terminals which are connected to the paired bit lines respectively.

14 Claims, 6 Drawing Sheets

FIG. 3B $C_{BL} = C_{BBL}$

FERROELECTRIC MEMORY DEVICE AND READ CONTROL METHOD THEREOF

CROSS-REFERENCE TO RELATED APPLICATION

This invention is based upon and claims the benefit of priority from the prior Japanese Patent Application No. 2002-099065, filed on Apr. 1, 2002, the entire contents of which ore incorporated herein by reference.

BACKGROUND OF THE INVENTION

1. Field of the Invention

This invention relates generally to ferroelectric memory devices with non-volatile data storability using ferroelectric capacitors and, more particularly, to a nonvolatile ferroelectric memory device having a cell block configured from a serial combination of multiple unit cells, each of which is made up of a parallel connection of one ferroelectric capacitor and one cell transistor. The invention also relates to a data read control method of this memory device.

2. Description of Related Art

Ferroelectric random access memory devices store data nonvolatilely in a way depending upon the magnitude of a remnant polarization of a ferroelectric capacitor. Prior known ferroelectric memory chips are designed in general so that a memory cell consists of a serial combination of a ferroelectric capacitor and a cell transistor in a similar way to that of dynamic random access memories (DRAMs). However, unlike the DRAMs, ferroelectric memories are nonvolatile memories of the type storing data based on the remnant polarization amount. Thus, it becomes necessary to drive a plate line in order to read signal charge onto a bit line. For the very reason, in prior art ferroelectric memories, plate-line driving circuitry must require consumption of a relatively large chip area.

In contrast, an advanced ferroelectric memory cell array scheme capable of reducing the on-chip area of plate-line drive circuitry has been proposed by Takashima et al. This scheme is the one that arranges a unit cell by connecting both ends of a ferroelectric capacitor (C) to the source and drain of a cell transistor (T) respectively and then serially connecting together a plurality of unit cells each having such TC parallel connection to thereby make up a cell block, as disclosed in D, Takashima et al., "High-Density Chain Ferroelectric Random Access Memory (CFRAM)," in Proc. VLSI Symp. June 1997, pp. 83–84. With this type of ferroelectric memory chips, also known au "TC parallel unit-cell series-connection" type ferroelectric memories, it is possible to permit a number, e.g. eight (8), of unit cells to commonly have or "share" a plate-line drive circuit, which in turn makes it possible to mount an increased number of cell arrays on a chip at higher integration densities,

SUMMARY OF THE INVENTION

A ferroelectric memory device in accordance with one aspect of this invention includes a cell block which is constituted from a serial connection of a plurality of unit cells each having a ferroelectric capacitor with both ends connected to a source and a drain of a transistor, a pair of bit lines to which both ends of the cell block are connected through block select gates respectively, a word line connected to a gate of each transistor of the cell block, a plate line to which a node of a unit cell at a specified position within the cell block is connected via a plate-line select gate, and a sense amplifier having differential input terminals connected to the paired bit lines respectively.

A ferroelectric memory device in accordance with another aspect of the invention includes a first cell block which is formed of a series connection of a plurality of unit cells each having a ferroelectric capacitor with its both ends connected to a source and a drain of a transistor, a pair of bit lines connectable to both ends of the first cell block respectively, a first block select line for control of connection and disconnection between one of the paired bit lines and the first cell block, a second block select line for control of connection and disconnection between a remaining one of the paired bit lines and the first cell block, a word line connected to a gate of each transistor of the first cell block, a first plate line connectable to the first cell block, a first plate-line select line for control of connection and disconnection between the first plate line and the first cell block, and a sense amplifier having differential input terminals connected to the paired bit lines respectively.

A read control method of a ferroelectric memory device in accordance with a further aspect of the invention is a read control method for use with a ferroelectric memory device which includes a cell block configured from a serial connection of a plurality of unit cells each having a ferroelectric capacitor with its both ends connected to a source and a drain of a transistor, a pair of bit lines connectable to both ends of the cell block respectively, a word line connected to a gate of each transistor of the cell block, and a plate line connectable to the cell block, wherein the read control method includes: a first step of causing each transistor of the plurality of unit cells to turn on resulting in these unit cells being in a non-select state while letting the cell block be disconnected from the paired bit lines; a second step of letting, after the first step, one of the paired bit lines to be subjected to data read be in an electrically floating state and also causing the transistor of a unit cell selected for data read from the plurality of unit cells to turn off to thereby select this unit cell; a third step, after the second step, of reading a signal voltage out of the selected unit cell to one of the paired bit lines by driving the plate line being connected to the cell block and also by connecting the cell block to the one of the paired bit lines: a fourth step, after the third step, of disconnecting the plate line from the cell block and connecting the cell block to a remaining one of the paired bit lines; and a fifth step, after the fourth step, of applying to the selected unit cell a voltage obtained by amplification of the signal voltage between the paired bit lines to thereby rewrite data into this unit cell.

DETAILED DESCRIPTION OF THE INVENTION

Some illustrative embodiments of this invention will be explained with reference to the accompanying drawings below.

Embodiment 1

Figure 1:
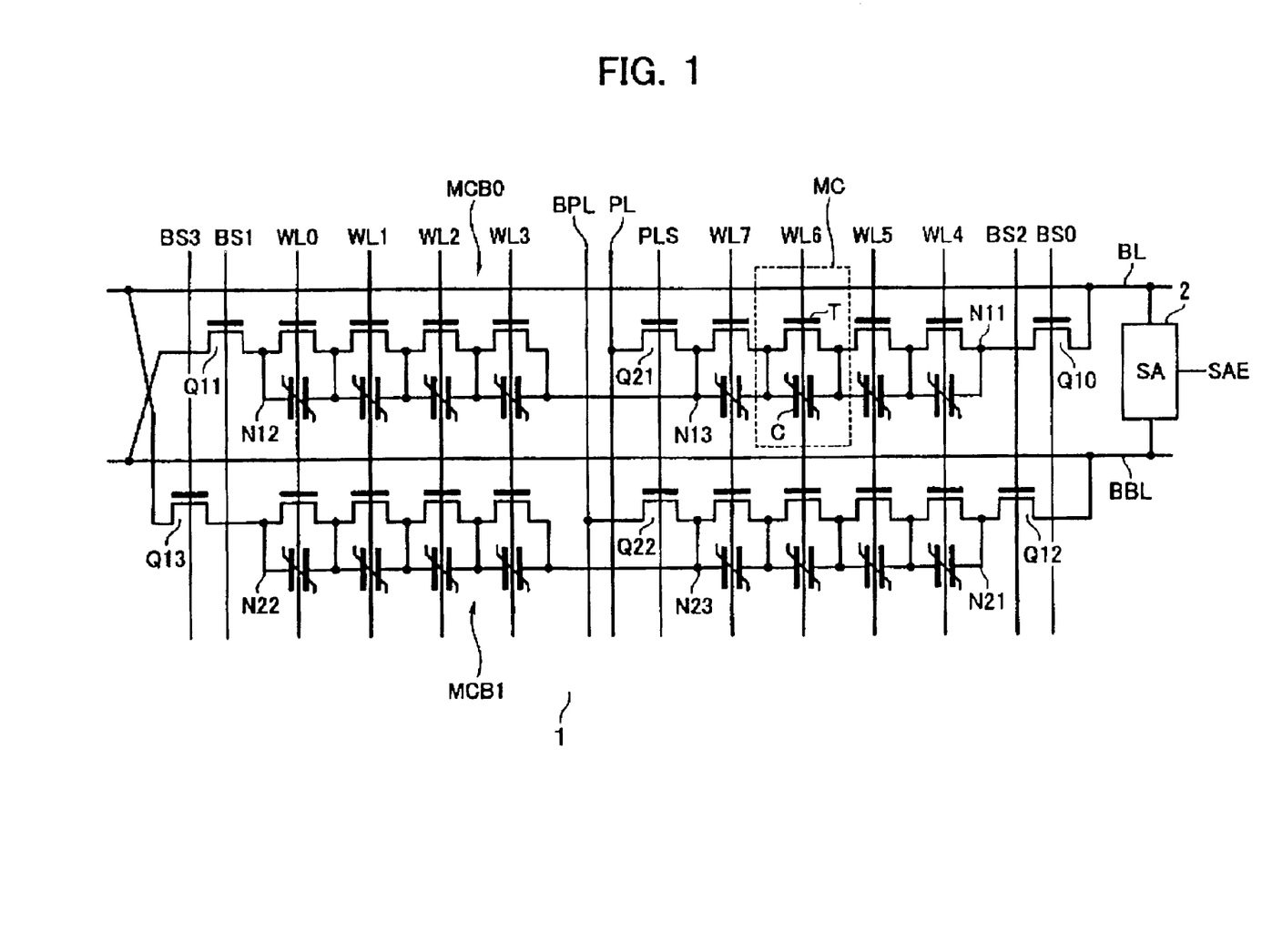
FIG. 1 is a diagram showing a cell array configuration of a ferroelectric memory device in accordance with an embodiment of this invention.

Referring to FIG. 1, there is shown a cell array 1 of a ferroelectric memory chip of the TC-parallel unit-cell series-connected configuration type in accordance with one embodiment of this invention. Although the cell array 1 includes a plurality of cell blocks as laid out into a matrix form, this drawing shows part involving a pair of bit lines BL, BBL and two cell blocks MCB0, MCB1 which are connected thereto respectively while making a pair. Each cell block MCB0, MCB1 is made up of a serial combination or "chain" of multiple memory cells MC, called unit cells. In the example of FIG. 1, eight (8) unit cells are connected in series within each cell block. The individual unit cell MC is constituted from a parallel combination of a transistor T and a ferroelectric capacitor C.

The cell block MCB0 has one terminate end N11 which is connected to the bit line BL through a block select gate Q10 and the other end connected to the other bit line BBL via a block select gate Q11. The block select gates Q10, Q11 are driven by different block select lines BS0, BS1. The remaining cell block MCB1 is such that its one end N21 is connected to bit line BBL via a block select gate Q12 and the other end is coupled to bit line BL via a block select gate Q13. These block select gates Q12–Q13 also are driven by different block select lines BS2, BS3. In this way, the block select lines are used to perform control of electrical connection and disconnection between the bit lines and cell blocks.

A sense amplifier 2 is provided which has its differential input terminals connected to the paired bit lines BL, BBL respectively. Word lines WL0 to WL7 are provided and connected to cross or intersect the bitlines BL, BBL in such a manner that each word line connects together the gates of transistors T of corresponding unit cells MC of the cell blocks MCB0, MCB1.

The cell blocks MCB0, MCB1 are associated with plate lines PL, BPL respectively. These plate lines PL, BPL are for use during data reading. Very importantly, plate lines PL, BPL are arranged to extend in parallel with the word lines WL0–WL7 in such a way as to accurately cross an intermediate portion (a central portion of the cell block) of the unit cell layout of such cell blocks MCB0, MCB1, rather than at an end portion thereof. Circuit nodes N13 and N23, each of which is at an intermediate position of the unit cell layout, are connected to the paired bit lines BL, BBL through plate-line select gates Q21, Q22 respectively. These plateline select gates Q21–Q22 are driven by a plateline select line PLS simultaneously. Accordingly, use of this plateline select line PLS enables achievement of the intended connection/disconnection control between the plate lines and the cell blocks.

Here, an example for comparison use will be explained for purposes of well understanding of this embodiment. See FIG. 6. This diagram shows a portion of the configuration of the cell array 1 of the TC parallel unit series-connected ferroelectric memory of the type stated above, which portion includes two neighboring cell blocks MCB0, MCB1 as connected to a pair of bit lines BL, BBL. Each cell block MCB0, MCB1 is made up of a serial connection or "chain" of a predetermined number, e.g. eight in this example of FIG. 6, of memory cells called unit cells MC, each having a parallel connection of a cell transistor T and a ferroelectric capacitor C.

Figure 6:
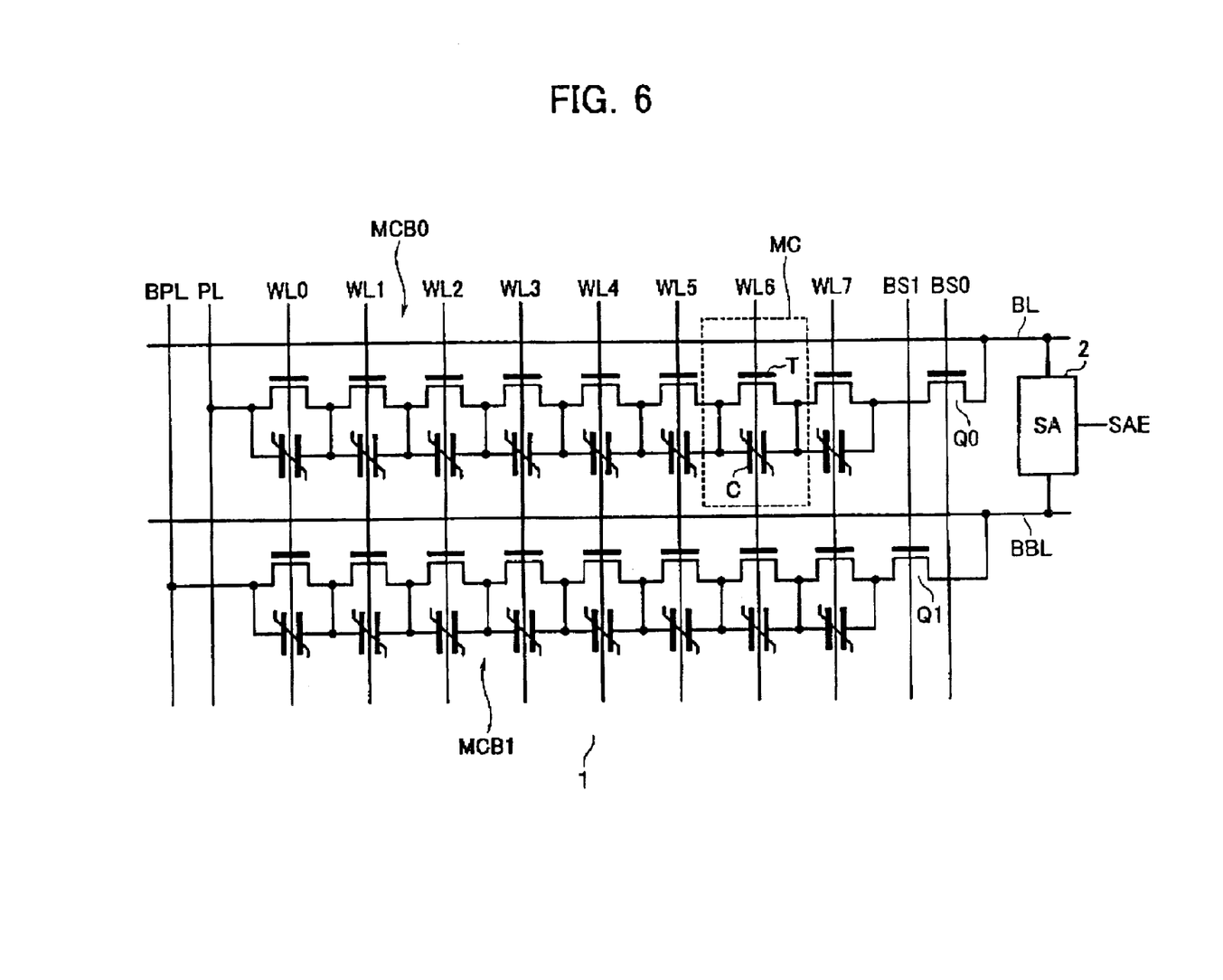
FIG. 6 is a diagram showing a cell array configuration of a ferroelectric memory in accordance with a comparative example.

Word lines WL0–WL7 are provided so that each wordline connects together the gates of transistors of corresponding unit cells in the cell blocks MCB0, MCB1. Cell blocks MCB0, MCB1 have terminate ends which are connected through block select gates Q0, Q1 to paired bit lines BL, BBL and also have opposite ends connected to plate lines PL, BPL respectively. A sense amplifier 2 is provided, which has its differential input terminals connected to the paired bitlines BL, BBL.

Figure 7:
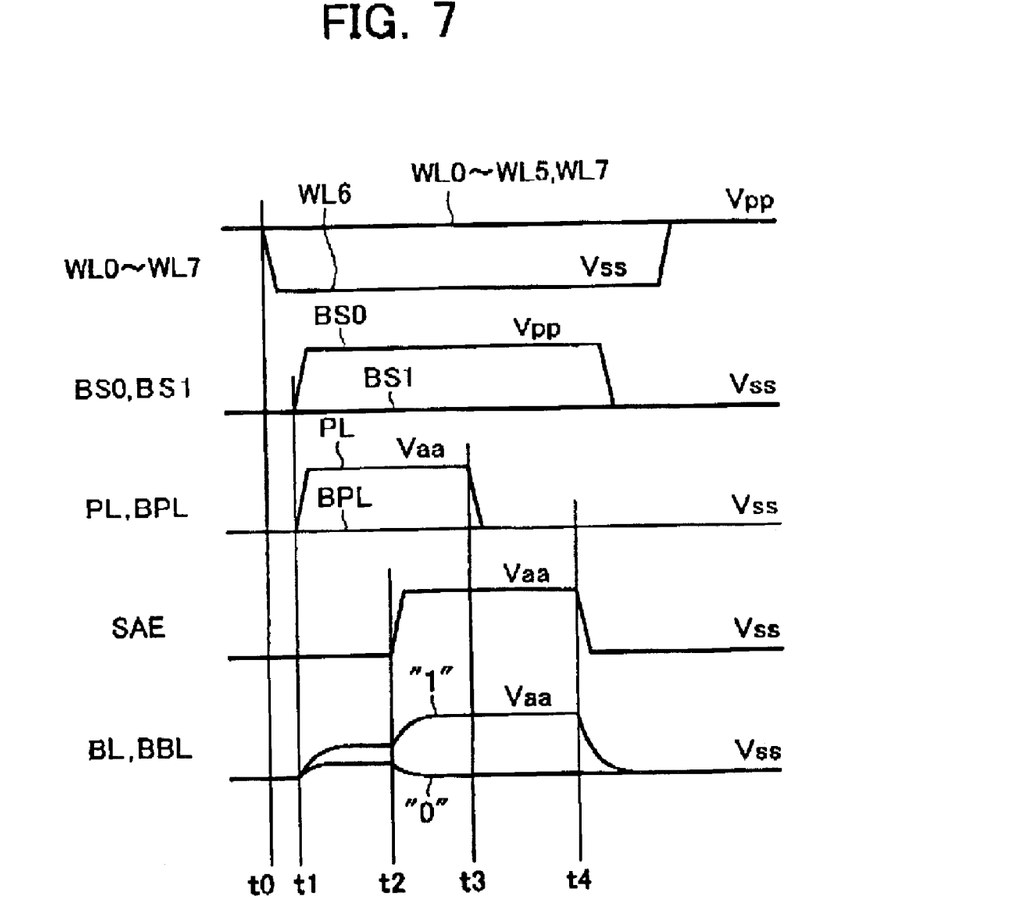
FIG. 7 is a timing diagram for explanation of an operation of the ferroelectric memory.

Turning to FIG. 7, there are shown waveforms of some major voltage signals generated during operation of the ferroelectric memory of FIG. 6. Suppose that a unit cell MC stores therein a bit of binary data while regarding it as a logic "1" when the ferroelectric capacitor C exhibits a positive remnant polarization and also defining it as a logic "0" when the remnant polarization is negative. In a standby cycle, all the wordlines are potentially kept at "High" or "H" level. Thus, data storage is achieved in the state that the transistor T of a unit cell within a cell block turns on causing the both ends of its associative ferroelectric capacitor C to be electrically shorted together. Prior to execution of a data read operation, the bitlines BL, BBL are precharged up to a source voltage or "ground" Vss.

The timing diagram of FIG. 7 assumes that a word line WL6 is presently selected to read data out of a unit cell in the cell block MCB0 and then perform a rewrite or "reprogramming" operation. Firstly at time point t0, let the wordline WL6 change in potential from "H" level—this is a potentially raised or boosted voltage Vpp—to "Low" or "L" level (=Vss), and then drive the transistor T of a corresponding unit cell MC to turn off, thereby enabling its associative ferroelectric capacitor C to be applied a voltage.

Thereafter, at time t1, set a block select signal BS0 for selection of the cell block MCB0 at "H" level (-Vpp); then, apply a voltage of "H" level (equal to a power supply voltage Vaa) to a specific one of the paired plate lines PL, BPL—that is, the plateline PL on the cell block MCB0 side. Whereby, a positive voltage Vaa from plateline PL is applied to the ferroelectric capacitor C of a presently selected unit cell MC so that data reading is carried out. In the case of logic "1" data with a positive remnant polarization state, data is read destructively while accompanying polarization reversal as a result of significant variation in polarization. In the case of logic "0" data with a negative remnant polarization, any large polarization changes hardly occur.

A potential change of the bitline BL at this time is read out at time t2 of FIG. 7, by activating the sense amplifier 2 which thus operates to amplify such potential change through comparison with an appropriate reference voltage being given to the other bitline BBL. Thereafter, at time t3, let the plateline PL returns to "L" level so that data rewrite is done. When "1" data is read out, the bitline BL is biased by sense amp 2 at "H" level (=Vaa). Setting the plateline PL at "L" level results in the ferroelectric capacitor being applied a reverse voltage to that during reading. Thus the ferroelectric capacitor that was once set in "0" data state again exhibits polarization reversal whereby "1" data is written thereinto. In the case of "0" data, no voltage is applied to the ferroelectric capacitor so that "0" data state is retained therein.

In the way state above, a read/rewrite operation of the ferroelectric memory of the comparative example is performed by applying a voltage to a selected ferroelectric capacitor between the plateline and bitline. In FIG. 7, suppose that a time period of t2 to t4 for activation of the sense amplifier 2 is a data write period. Within its first half period t2–t3, the plateline PL stays at "H" level permitting the potential of bitline BL to be amplified by the sense amp. Within the remaining, second half period t3–t4, let plateline PL to return at low level. Whereby, rewriting is done by applying a reverse voltage to the ferroelectric capacitor (in the case of "1" data) or alternatively eliminating any voltage application thereto (in the case of "0" data).

The above scheme requires execution of such two-stage write operation and thus is faced with a problem that much time is taken to perform writing. Within the period t2–t3, the plateline PL is held at "H" level so that any write voltage is not substantially applied to the ferroelectric capacitor even when the bitline BL becomes at "H." It is within its following period t3–t4 that the write voltage is actually applied to the ferroelectric capacitor. Even in such event, a fixed length of time period is taken for polarization reversal. Additionally, when returning the plateline PL to "L" level at a time point within the period t2–t4, the bitline BL experiences an unwanted potential drop-down due to the presence of capacitive coupling. This also serves as a serious bar to achievement of high-speed write operations.

In particular, in cases where a great number of cell blocks are laid out in the wordline direction resulting in a plateline shared thereby having a large capacitance when compared to a bitline, an increased length of time period is required for the plateline to transit from "H" to "L" level also. This also leads to an increase in write time. Even if the period t2–t3 is shortened, the influence of the capacitive coupling and potential transition due to the plateline PL it is hardly avoidable.

In this respect, another approach is known, which employs a scheme that does not change the plateline in potential unlike the above-noted scheme—that is, set the plateline at a fixed potential level of Vaa/2 by way of example to perform the intended data read/rewrite operation. Unfortunately this scheme does not come without accompanying a problem as to an inability to create any sufficient polarization reversal during reading of "1" data. This is due to the fact that the voltage being applied to a ferroelectric capacitor during reading is less in potential. Thus, there is a demerit that the power supply voltage Vaa must be made higher in potential in order to perform a read operation accompanied with significant polarization reversal.

The foregoing explanation is of the comparative example. The embodiment shown in FIG. 1 is distinguishable therefrom in that data writing is performed by applying a voltage to a unit cell as selected between the paired bit lines BL, BBL without having to utilize the plate lines PL, BPL. Data reading is done by application of a read voltage from the intermediate nodes N13, N23 of the cell block.

More specifically, upon reading of a unit cell which is selected from among those at left half part of the cell block MCB0, apply a positive read voltage from the plate line PL between the plateline PL and the bitline BBL. When reading a unit cell at the right half part of cell block MCB0, apply a positive read voltage from the plateline PL between the plateline PL and bitline BL. Upon reading of a unit cell selected from among those at the left half part of another cell block MCB1, apply a positive read voltage from the plateline BPL between the plateline BPL and bitline BL; when reading a unit cell at the right half part of cell block MCB1, apply a positive read voltage from plateline BPL between the plateline BPL and bitline BBL.

A detailed explanation will be given of an operation of the ferroelectric memory of this embodiment with reference to FIG. 2. Suppose that the unit cells MC are memory cells each storing a bit of binary data depending upon the state of a remnant polarization of a ferroelectric capacitor C being written by positive voltage application from the bitline BL or BBL: if the remnant polarization is positive in polarity, then the data bit stored is a logic "1"; if the polarization is negative then the data is a logic "0." In a standby cycle, all the wordlines WL stay at "H" level (=boosted voltage Vpp). The block select lines BS0–BS3 and platelines PL, BPL and also paired bitlines BL, BBL are set at "L" level (=Vss), while the plateline select line PLS is held at "H" level (=Vpp). With such voltage setup, the cell transistors T of all the unit cells involved within each cell block turn on (i.e., all unit cells are in the non-select state). Accordingly, the ferroelectric capacitor C associated with each transistor T is such that its both terminals are electrically shorted together and thus stores data therein.

Figure 2:
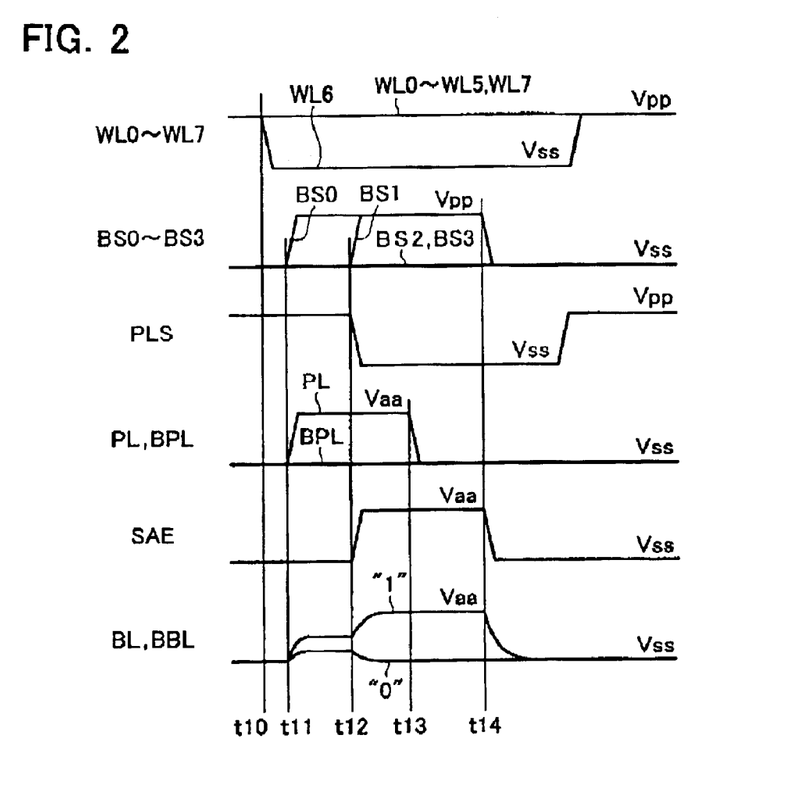
FIG. 2 is a timing diagram for explanation of an operation of the ferroelectric memory.

FIG. 2 shows waveforms of some major voltage signals available when a unit cell is selected by a wordline WL6 from among those of the cell block MCB0 and is then subjected to data read/rewrite. When entering an active session, the selected wordline WL6 potentially changes to "L" level (=Vss) at time point t10. Whereby, at the unit cell being selected by wordline WL6, its cell transistor T turns off, thus establishing the state that permits a read voltage to be applied to the ferroelectric capacitor C.

Thereafter, set a bitline BL onto which data is to be read (this bitline has been precharged to Vss in advance) in an electrically floating state. Then, in order to cause a select gate Q10 on the bitline BL side of cell block MCB0 to turn on, apply a voltage of "H" level (=Vpp) to select gate line BS0 to thereby connect cell block MCB0 to bitline BL. Simultaneously drive plateline PL so that it becomes at "H" level (=supply voltage Vaa) at time t11 of FIG. 2. At this time the other select gate lines BS1–BS3 and plateline BPL stay at "L" level. Whereby, only at the unit cell being presently selected by wordline WL6 within cell block MCB0, a positive voltage from plateline PL is applied to its ferroelectric capacitor, causing a signal voltage to be read out onto bitline BL in accordance with data "1" or "0."

The signal voltage thus read onto the bitline BL is then sensed and amplified by comparison to a reference voltage being given to the bitline BBL paired with bitline BL. More specifically, set the plateline select line PLS at "L" level to thereby electrically disconnect plateline PL. Instead, set block select signal line BS1 at "H" level, causing the node N12 of cell block MCB0 to bitline BBL while setting a sense-amp enable signal SAE at "H" level at time t12. Whereby, the sense amp 2 is activated to amplify a voltage potential across the paired bitlines BL, BBL. Thus, the bitline BL potentially goes high to "H" level (=Vaa) in the case of data "1." In the case of data "0," bitline BL potentially drops down at "L" level (=Vss).

In the case of "1" data reading, destructive readout accompanying a remnant polarization reversal is established. In the case of "0" data read, reading is done nondestructively. In these read sessions, a read operation owing to the sense amplifier 2 directly becomes a rewrite operation. Thereafter, let the plateline PL return to "L" level at an appropriate time point t13 of FIG. 2. Note that prior to this plateline potential recovery, plateline PL has already been electrically disconnected from the node N13. Without regard to its potential change, a rewrite operation is done using a read voltage between the paired bitlines BL, BBL. More specifically, when "1" data is read out, owing to the positive voltage of bitline BL, the ferroelectric capacitor is applied a reverse voltage to that during reading. Thus this capacitor is again rewritten into the "1" data state with a positive remnant polarization. In case "0" data is read, the ferroelectric capacitor no longer experiences such reverse voltage application so that this capacitor is rewritten or restored to have its original negative remnant polarization state.

In the way stated above, when a unit cell at the right half part of the cell block MCB0 is selected, the positive read voltage application from the plateline PL permits execution of a read/rewrite operation with the bitline BL becoming at "H" in the case of "1" data. In contrast, when a unit cell is selected from among those at the left half part of cell block MCB0, a signal voltage is read onto the bitline BBL, resulting in this bitline BBL becoming at "H" in the case of "1" data. Adversely in another cell block MCB1, when a unit cell of the right half part of it is selected, bitline BBL becomes at "H" in the case of "1" data; when a unit cell of the left half part is selected, bitline BL is at "H" in the case of "1" data.

Figure 3A:
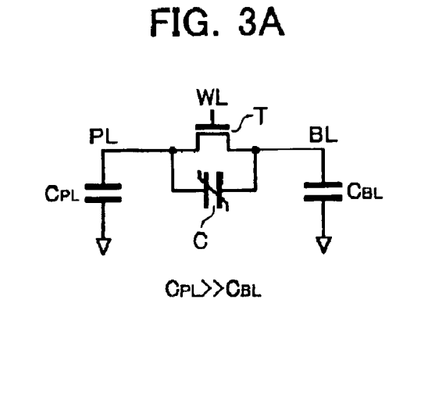
FIG. 3A is a diagram showing a connection relationship during writing of a unit cell of a ferroelectric memory of FIG. 6 in accordance with an example for comparison use.
Figure 3B:
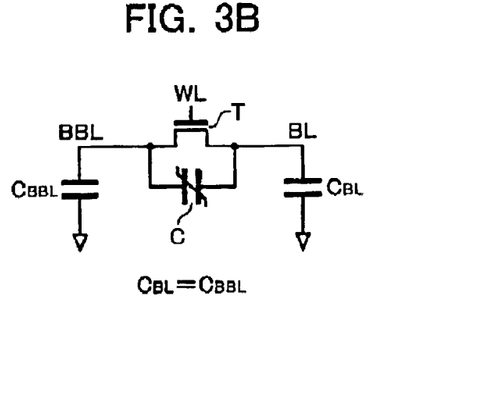
FIG. 3B is a diagram showing a connection relation during writing of a unit cell of the ferroelectric memory of FIG. 1.

Letting in this embodiment the time period t12–t14 for sense-amp activation be a write cycle, comparison of it with the scheme of the comparative example as set forth in conjunction with FIG. 7 is as follows. FIGS. 3A and 3B show connection relationships at the time of data writing while comparing the scheme of the comparative example to the scheme of this embodiment. In the comparative example's scheme, the plateline PL is connected to one end of a unit cell as shown in FIG. 3A. On the contrary, this embodiment is such that the unit cell is connected between the paired bitlines BL, BBL as shown in FIG. 3B.

Assuming that the capacitance CPL of the plateline PL is sufficiently greater than the bitline capacitance $C_{BL}=C_{BBL}$, the comparative example's scheme is such that the presence of capacitive coupling and the delay in potential transition occurring when transiting the potential of plateline PL at a time during writing make the write time duration longer. In contrast, with this embodiment, the plateline PL is electrically disconnected or isolated from the unit cell within the write time period t12–t14, thereby allowing the sense amp-amplified voltages of bitlines BL, BBL to be directly applied to the ferroelectric capacitor. Thus it becomes possible to write or "program" data at ultra-high speeds without being affected by the plateline PL's large capacitance and its potential transition.

Embodiment 2

Figure 4:
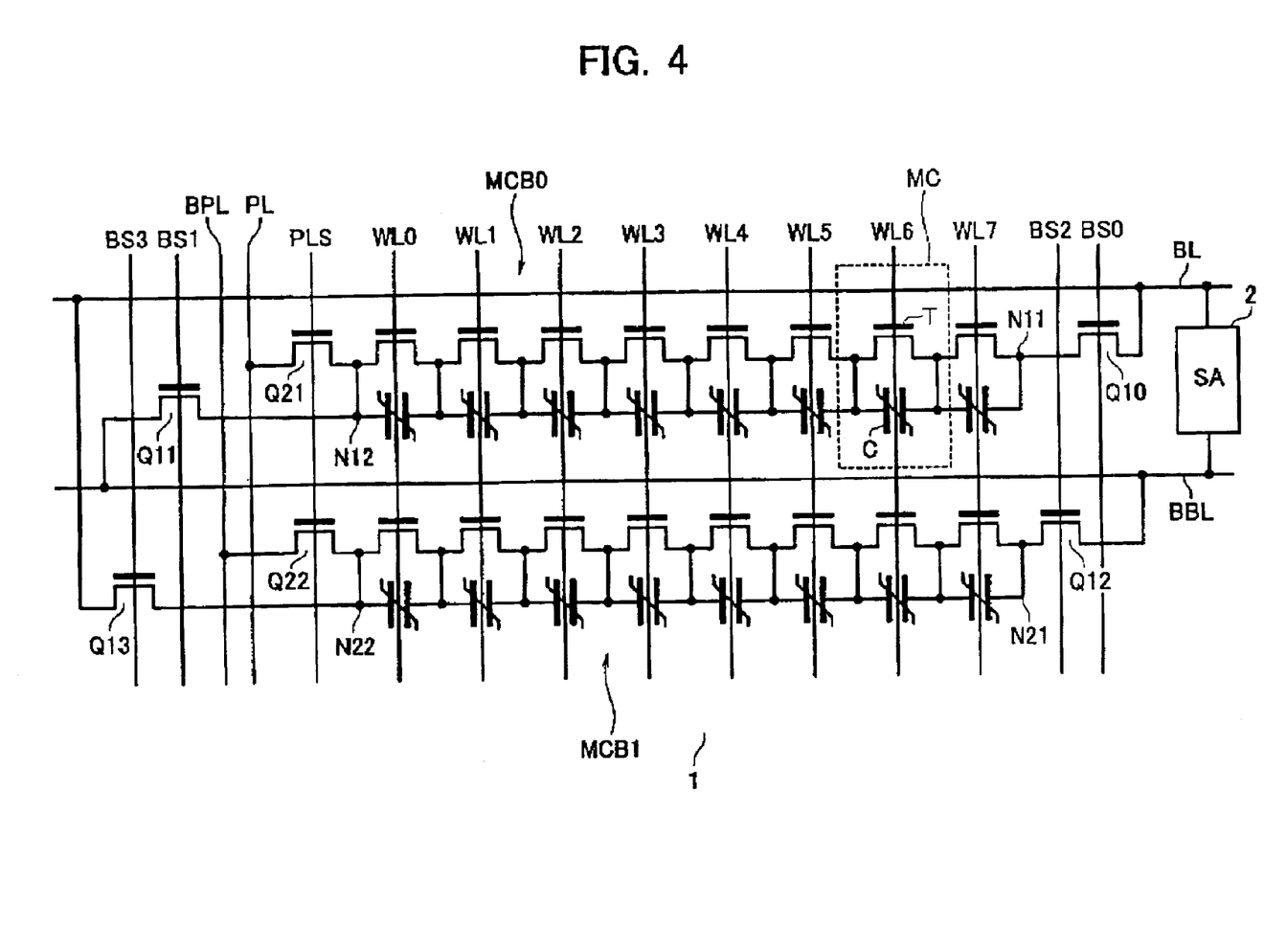
FIG. 4 is a diagram showing a cell array configuration of a ferroelectric memory in accordance with another embodiment of the invention.

Turning to FIG. 4, there is shown a configuration of a cell array 1 in accordance with another embodiment of the invention, in a way corresponding to FIG. 1. This cell array is similar to that of Embodiment 1 in that cell blocks MCB0, MCB1 have one-side terminate ends N11, N21 which are connected through block select gates Q10, Q12 to paired bit lines BL, BBL respectively and the other ends N12, N22 that are coupled via block select gates 11, Q13 to the bitlines BBL, BL respectively.

A difference of this embodiment from the previous embodiment lies in the connection positions of plate lines PL, BPL. These platelines are connected via plateline select gates Q21, Q22 to the ends N12, N22 of cell blocks MCB0, MCB1 respectively. In other words, the cell array 1 of FIG. 4 is arranged to perform switching in such a way as to connect the ends N12, N22 of cell blocks MCB0, MCB1 to platelines PL, BPL during reading and connect them to bitlines BBL, BL in its following rewrite session.

A data read/rewrite operation in this embodiment is the same as that of Embodiment 1. More specifically, in case a wordline WL6 is selected, read/rewrite is performed at the timings of FIG. 2. In the case of this embodiment also, a write operation is done by using the read voltage between bitlines BL, BBL in the absence of any influence of platelines PL, BPL. Thus it becomes possible to perform write operations at ultrahigh speeds.

Although in Embodiment 1 stated supra the destination to which a signal voltage is read is selectively changed between the bitlines BL, BBL depending upon whether a presently selected unit cell belongs to the left half part or the right half part of a cell block, this embodiment is arranged so that the platelines are connected to the cell block end portions. Consequently, all the unit cells are subjected to read/rewrite operations with the bitline BL biased at "H" level in the case of "1" data in a similar way to that of the prior art.

Embodiment 3

Figure 5:
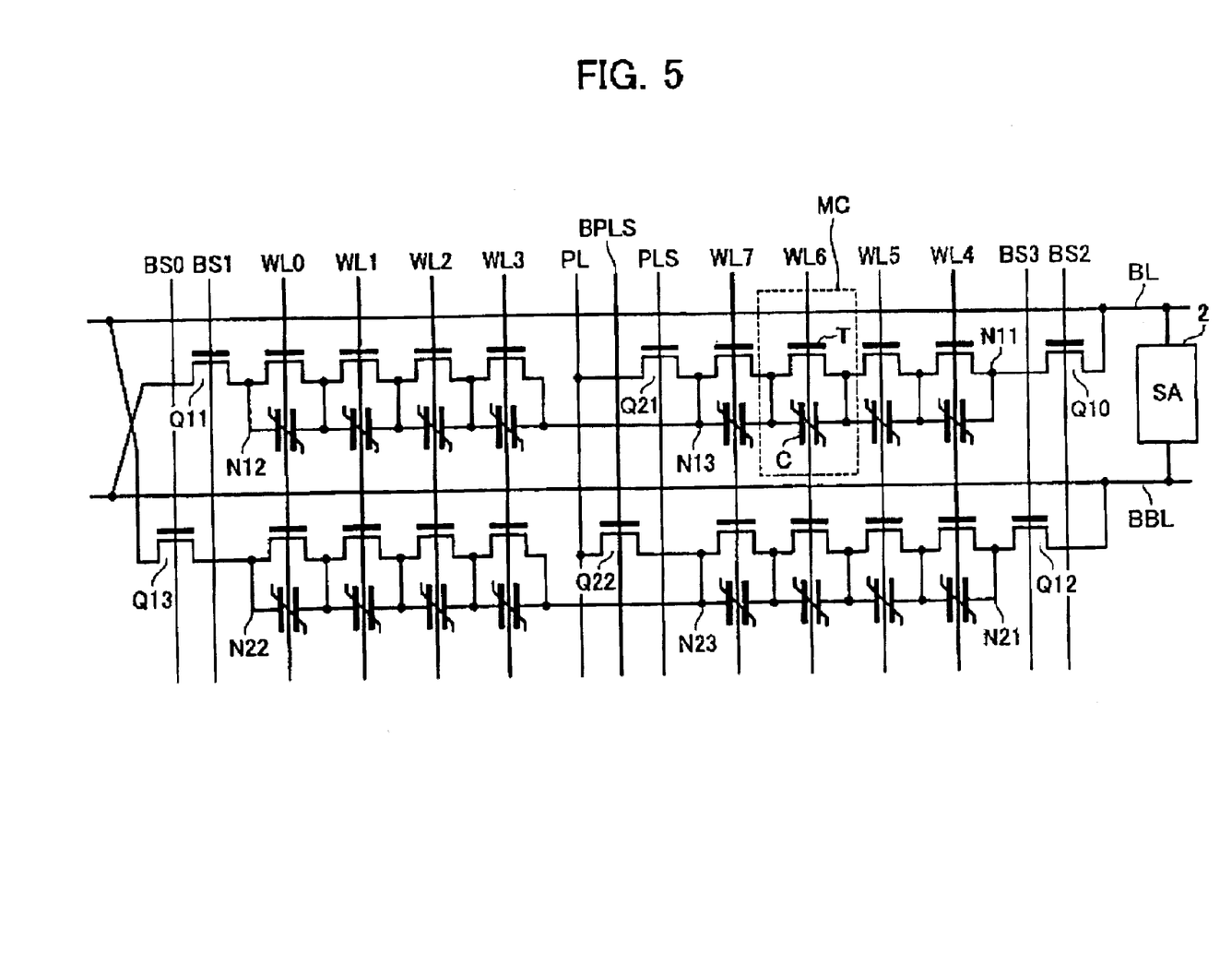
FIG. 5 is a diagram showing a cell array configuration of a ferroelectric memory in accordance with a further embodiment of the invention.

FIG. 5 shows a configuration of a cell array 1 in accordance with a further embodiment of the invention in a way corresponding to FIG. 1. This embodiment is similar to Embodiment 1 in that cell blocks MCB0, MCB1 have one-side ends N11, N21 which are connected via block select gates Q10, Q12 to paired bitlines BL, BBL respectively and the other ends N12, N22 that are connected via block select gates Q11, Q13 to the bitlines BBL, BL respectively.

This embodiment is a modified version of the embodiment of FIG. 1 and is arranged so that paired cell blocks MCB0, MCB1 share a single plate line PL. More specifically, one plateline PL is prepared which is selectively connected to either one of the intermediate nodes N13, N23 of cell blocks MCB0, MCB1. To attain such selective connection of plateline PL to node N13 or N23, plateline select gates Q21, Q22 are interposed between plateline PL and intermediate nodes N13, N23 and are driven by different select lines PLS, BPLS. With such an arrangement, a similar operation to that of the FIG. 1 embodiment becomes possible.

Similar modification is employable also for the embodiment of FIG. 4. In other words, when in the configuration of FIG. 5 the platelines PL, BPL are bundled together into a single line while at the same time using separate select lines to drive the plateline select gates Q21–Q22 independently, a similar operation to that of the FIG. 4 embodiment is achievable.

Additionally, as readily presumable from the FIG. 4 embodiment, the platelines may be designed so that these are connected via select gates to the other ends N11, N21 of the cell blocks MCB0, MCB1. Another available alteration is that the platelines are connected via select gates to unit-cell connection nodes at any appropriate locations within the cell blocks, other than the intermediate nodes and both ends thereof.

Principal features of the embodiments stated above may be summarized as follows. According to the embodiments, high-speed data write is enabled by providing changeability or switchability between voltage application from a plateline with respect to a unit cell within a cell block and voltage application between bitlines with respect to a unit cell while electrically disconnecting the plateline from the cell block.

More specifically, in a read mode, apply a read voltage between a plateline and either one of paired bitlines with respect to a unit cell being presently selected by a word line within a cell block, thereby forcing a signal voltage to output onto the either one of the paired bitlines. In a write mode, electrically disconnect the plateline from the cell block and then apply to the selected unit cell a specific voltage which is obtained by amplification of the signal voltage between the paired bitlines.

In the embodiments, the plateline may be connected via a plateline select gate to any adequate connection node of a unit cell array within the cell block. One example is that the plateline is connected to an intermediate node of the unit cell array (as shown in FIGS. 1 and 5). Another example is that the plateline is connected to one end portion of ouch unit cell array (FIG. 4).

A practically implemented arrangement usable in the embodiments is that the cell array is associated with word lines and bit line pairs which intersect each other and includes cell blocks with every group of two adjacent ones making a pair which is commonly driven by a word line. In this case a first cell block of such paired cell blocks has one end connected via a first block select gate to either one of the paired bitlines and the other end connected via a second block select gate to the remaining one of the paired bitlines; a second cell block of the paired cell blocks has one end connected via a third block select gate to the other one of the paired bitlines and a remaining end coupled via a fourth block select gate to the one of the paired bitlines. With such an arrangement, the paired cell blocks are such that only either one of them is selected causing a signal voltage of a selected unit cell to be read out onto one of the paired bitlines, which signal voltage is then amplified through comparison with a reference voltage being given to the other bitline.

As previously stated, the paired cell blocks are prevented from being selected simultaneously in any way. Thus the plate lines may be prepared separately although a single shared plate line is employable when a need arises. An example is that (a) as shown in FIGS. 1 and 4, first and second platelines extending in parallel to the wordlines are provided in a way corresponding to paired cell blocks respectively, wherein specified nodes of the unit cells within the paired cell blocks are connected to the first and second platelines through simultaneously driven first and second plateline select gates, respectively. Another example is that (b) as shown in FIG. 5, a shared plateline for common use by paired cell blocks is provided in parallel to the word lines while letting certain nodes of the unit cells within the paired cell blocks be connected to this shared plateline through independently driven first and second plateline select gates.

It has been stated that according to this invention, it is possible to obtain a nonvolatile ferroelectric memory device capable of offering high-speed writing capabilities by enabling selective or "on/off" connection between unit-cell nodes and a plateline and also by execution of a write operation while directly applying a signal voltage being read out between paired bit lines to between the terminals of the ferroelectric capacitor of a unit cell.

While the present invention has been particularly shown and described with reference to the embodiments, it will be understood by those skilled in the art that various changes in form and in detail may be made without departing from the spirit, scope and teachings of the invention.

What is claimed is:

1. A ferroelectric memory device comprising:
   a cell block including a serial connection of a plurality of unit cells each having a ferroelectric capacitor with both ends connected to a source and a drain of a transistor;
   a pair of bit lines, one of said pair of bit lines connected through one block select gate to one end of said cell block and a remaining one of said pair of bit lines connected through the other block select gate to a remaining end of said cell block;
   a word line connected to a gate of each transistor of said cell block;
   a plate line to which a node of a unit cell at a specified position within said cell block is connected via a plate-line select gate; and
   a sense amplifier having differential inputs connected to the paired bit lines respectively.

2. The ferroelectric memory device according to claim 1, wherein said device is operated by:
   a read mode for letting a signal voltage be output to one of said paired bit lines while applying a read voltage between said plate line and one of said paired bit lines with respect to a unit cell selected by said word line within said cell block; and
   a write mode for disconnecting said plate line from said cell block and for applying to the selected unit cell an amplified voltage of said signal voltage between said paired bit lines.

3. The ferroelectric memory device according to claim 1, wherein said plate line is connected via said plate-line select gate to an intermediate node of a unit cell array within said cell block.

4. The ferroelectric memory device according to claim 1, wherein said plate line is connected via said plate-line select gate to one end portion of a unit cell array within said cell block.

5. The ferroelectric memory device according to claim 1, wherein said word line and the bit line pair are crossing each other, wherein a plurality of cell blocks are laid out while letting every group of two cell blocks driven in common by said word line make a pair, wherein a first cell block included in the paired cell blocks has one end connected to one of the paired bit lines through a first block select gate and a remaining end connected via a second block select gate to a remaining one of said paired bit lines, and wherein a second cell block of said paired cell blocks has one end connected to the remaining one of said paired bit lines via a third block select gate and a remaining end connected via a fourth block select gate to one of said paired bit lines.

6. The ferroelectric memory device according to claim 5, wherein first and second plate lines extending in parallel to said word line are provided in a way corresponding to said paired cell blocks respectively, and wherein certain nodes of unit cells within said paired cell blocks are connected to said first and second plate lines through simultaneously driven first and second plate-line select gates respectively.

7. The ferroelectric memory device according to claim 5, wherein a plate line shared by said paired cell blocks is provided in parallel to said word line, and wherein certain nodes of unit cells within said paired cell blocks are connected to said plate line through the first and second plate-line select gate being driven independently of each other.

8. A ferroelectric memory device comprising:
a first cell block including a series connection of a plurality of unit cells each having a ferroelectric capacitor with its both ends connected to a source and a drain of a transistor;
a pair of bit lines, one of said pair of bit lines connected to one end of said first cell block and a remaining one of said pair of bit lines connected to a remaining end of said first cell block;
a first block select line for control of connection and disconnection between one of the paired bit lines and said first cell block;
a second block select line for control of connection and disconnection between a remaining one of said paired bit lines and said first cell block;
a word line connected to a gate of each transistor of said first cell block;
a first plate line connectable to said first cell block;
a first plate-line select line for control of connection and disconnection between said first plate line and said first cell block; and
a sense amplifier having differential inputs connected to said paired bit lines respectively.

9. The ferroelectric memory device according to claim 8, further comprising:
a second cell block sharing said word line and said paired bit lines with said first cell block;
a third block select line for control of connection and disconnection between the remaining one of said paired bit lines and said second cell block; and
a fourth block select line for control of connection and disconnection between one of said paired bit lines and said second cell block.

10. The ferroelectric memory device according to claim 9, further comprising:
a second plate line connectable to said second cell block, wherein said first plate-line select line is used to contact connection and disconnection between said second plate line and said second cell block.

11. The ferroelectric memory device according to claim 9, further comprising:
a second plate-line select line for control of connection and disconnection between said first plate line and said second cell block.

12. The ferroelectric memory device according to claim 8, wherein said first plate line and said first cell block are connectable together at a central portion of said first cell block.

13. The ferroelectric memory device according to claim 8, wherein said first plate line and said first cell block are connectable together at an end portion of said first cell block.

14. A read control method of a ferroelectric memory device comprising:
a cell block including a serial connection of a plurality of unit cells each having a ferroelectric capacitor with its both ends connected to a source and a drain of a transistor;
a pair of bit lines, one of said pair of bit lines connected to one end of said cell block and a remaining one of said pair of bit lines connected to a remaining end of said cell block;
a word line connected to a gate of each transistor of said cell block, and a plate line connectable to said cell block; and
a plate line connectable to said cell block, said method comprising:
a first step of causing each transistor of said plurality of unit cells to turn on resulting in said unit cells being in a non-select state while letting said cell block be disconnected from the paired bit lines;
a second step of letting, after said first step, one of said paired bit lines to be subjected to data read be in an electrically floating state and also causing said transistor of a unit cell selected for data read from said plurality of unit cells to turn off to thereby select this unit cell;
a third step, after said second step, of reading a signal voltage out of the selected unit cell to one of said paired bit lines by driving said plate line being connected to said cell block and also by connecting said cell block to the one of said paired bit lines;
fourth step, after said third step, of disconnecting said plate line from said cell block and connecting said cell block to a remaining one of said paired bit lines; and
a fifth step, after said fourth step, of applying to said selected unit cell a voltage obtained by amplification of said signal voltage between said paired bit lines to thereby rewrite data into this unit cell.

* * * * *